(12) United States Patent
Pawlowski et al.

(10) Patent No.: US 9,027,237 B2
(45) Date of Patent: May 12, 2015

(54) METHOD FOR PRODUCING OPTOELECTRONIC COMPONENTS, AND PRODUCTS PRODUCED THEREBY

(75) Inventors: Edgar Pawlowski, Stadecken-Elsheim (DE); Ralf Biertuempfel, Mainz-Kastel (DE); Bernd Woelfing, Mainz (DE); Frank Fleissner, Mainz (DE); Petra Auchter-Krummel, Vendershein (DE); Ulf Brauneck, Gross-Umstadt (DE); Joseph S. Hayden, Clarks Summit, PA (US); Ulrich Fotheringham, Wiesbaden (DE)

(73) Assignee: Schott AG (DE)

( * ) Notice: Subject to any disclaimer, the term of this patent is extended or adjusted under 35 U.S.C. 154(b) by 763 days.

(21) Appl. No.: 12/373,066

(22) PCT Filed: Jul. 5, 2007

(86) PCT No.: PCT/EP2007/005955
§ 371 (c)(1),
(2), (4) Date: May 6, 2009

(87) PCT Pub. No.: WO2008/006504
PCT Pub. Date: Jan. 17, 2008

(65) Prior Publication Data
US 2009/0217516 A1 Sep. 3, 2009

Related U.S. Application Data

(60) Provisional application No. 60/819,705, filed on Jul. 10, 2006.

(30) Foreign Application Priority Data

Jul. 10, 2006 (DE) .......................... 10 2006 032 047

(51) Int. Cl.
*H05K 3/30* (2006.01)
*H01L 27/146* (2006.01)
(Continued)

(52) U.S. Cl.
CPC ........ *H01L 27/14685* (2013.01); *C03B 11/082* (2013.01); *C03B 2215/05* (2013.01);
(Continued)

(58) Field of Classification Search
CPC ...... C03B 11/082; C03C 19/00; C03C 17/02; H01L 31/0232; H01L 27/14632; H01L 27/14687; H01L 27/14618; H01L 27/14625; H01L 27/14685; H01L 37/0203
USPC .......... 29/834, 832, 833, 836; 438/27, 51, 57, 438/64, 68; 348/294
See application file for complete search history.

(56) References Cited

U.S. PATENT DOCUMENTS 6,124,145 A * 9/2000 Stemme et al. .................. 438/26
6,384,951 B1 * 5/2002 Basiji et al. ................. 359/212.1
(Continued)

FOREIGN PATENT DOCUMENTS

EP 1 079 613 A2 2/2001
EP 1 387 397 A2 2/2004
(Continued)

OTHER PUBLICATIONS

German International Searching Authority, PCT Search Report and Written Opinon, Dated Mar. 20, 2008.
(Continued)

*Primary Examiner* — David Angwin
(74) *Attorney, Agent, or Firm* — Kaplan Breyer Schwarz & Ottesen, LLP

(57) ABSTRACT

A method for producing optoelectronic components, the method comprising the steps of: providing optical components; picking up, by means of a robot arm, the optical components provided; subsequent to picking up the optical components, mounting the optical components directly on a first wafer by means of the robot arm; wherein the first wafer has optoelectronic components attached, and the optical components being positioned individually or in groups relative to the position of the optoelectronic components of the first wafer using the robot arm; and utilizing, as the first wafer, a glass wafer having i) spectrally filtering glass being an infrared filter glass and ii) an infrared filter coating, the glass wafer having a thickness in the range of 50 to 500 micrometers.

8 Claims, 10 Drawing Sheets

Figure 1:
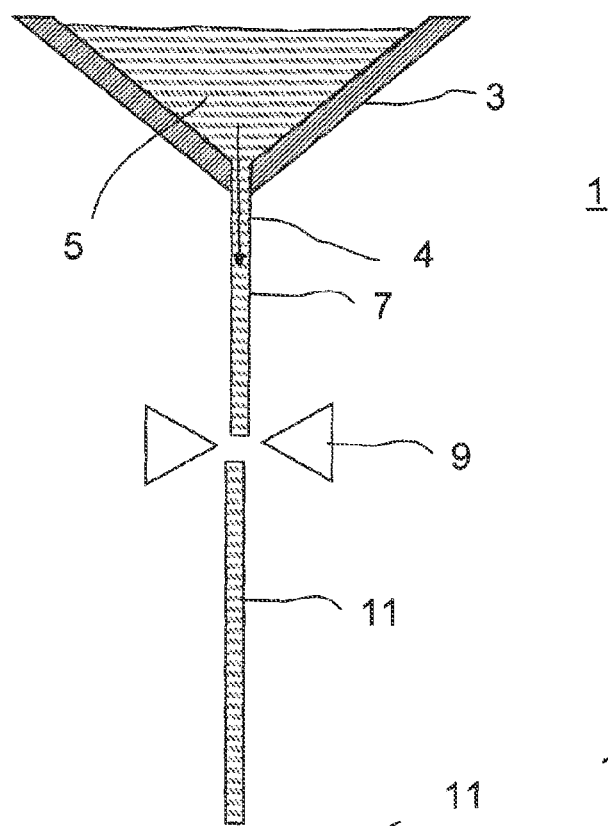

(51) Int. Cl.

| | | |
|---|---|---|
| *C03B 11/08* | (2006.01) | |
| *C03C 17/02* | (2006.01) | |
| *C03C 19/00* | (2006.01) | |
| *H01L 31/0203* | (2014.01) | |
| *H01L 31/0232* | (2014.01) | |
| *C03B 17/06* | (2006.01) | |

(52) U.S. Cl.
CPC ........... *C03B2215/414* (2013.01); *C03C 17/02* (2013.01); *C03C 19/00* (2013.01); *H01L 27/14618* (2013.01); *H01L 27/1462* (2013.01); *H01L 27/14621* (2013.01); *H01L 27/14625* (2013.01); *H01L 27/14632* (2013.01); *H01L 27/14687* (2013.01); *H01L 31/0203* (2013.01); *H01L 31/0232* (2013.01); *C03B 17/06* (2013.01)

(56) References Cited

U.S. PATENT DOCUMENTS

| | | | |
|---|---|---|---|
| 6,429,036 B1* | 8/2002 | Nixon et al. ............... | 438/57 |
| 6,436,853 B2* | 8/2002 | Lin et al. .................. | 438/800 |
| 6,548,322 B1* | 4/2003 | Stemme et al. ............ | 438/57 |
| 6,750,939 B2* | 6/2004 | Sojourner et al. ......... | 349/189 |
| 6,846,692 B2* | 1/2005 | Silverbrook ............... | 438/51 |
| 6,995,034 B2* | 2/2006 | Patel et al. ................ | 438/64 |
| 7,109,066 B2* | 9/2006 | Yang ........................ | 438/125 |
| 7,198,982 B2* | 4/2007 | Patel et al. ................ | 438/107 |
| 7,226,862 B2* | 6/2007 | Staehler et al. ............ | 438/689 |
| 7,394,059 B2* | 7/2008 | Fukuyoshi et al. ........ | 250/226 |
| 7,939,350 B2* | 5/2011 | Tsai ........................... | 438/28 |
| 2003/0164891 A1* | 9/2003 | Akimoto ................... | 348/340 |
| 2003/0219211 A1* | 11/2003 | Kim et al. ................. | 385/52 |
| 2004/0057488 A1* | 3/2004 | Hirukawa ................. | 372/46 |
| 2004/0063235 A1* | 4/2004 | Chang ...................... | 438/27 |
| 2005/0258349 A1* | 11/2005 | Matsuyama et al. ..... | 250/226 |
| 2006/0073630 A1* | 4/2006 | Liu ........................... | 438/68 |
| 2009/0217516 A1* | 9/2009 | Pawlowski et al. ...... | 29/832 |
| 2009/0275170 A1* | 11/2009 | Chen ......................... | 438/106 |

FOREIGN PATENT DOCUMENTS

| | | |
|---|---|---|
| EP | 1 466 875 A2 | 10/2004 |
| EP | 1 614 663 A1 | 1/2006 |

OTHER PUBLICATIONS

Agnes Wittmann-Regis, "International Application No. PCT/EP2007/005955 International Preliminary Report on Patentability", Feb. 5, 2009, Publisher: PCT, Published in: EP.

Gale et al., "Active alignment of replicated microlens arrays on a charge-coupled device imager", May 1997, pp. 1510-1517, vol. 36, No. 5, Publisher: Optical Engineering, Published in: Zurich, Switzerland.

German Patent Office, "German Office Action for German International Application No. 10 2006 032 047.6-33 dated Dec. 8, 2010", Publisher: German Patent Office, Published in: Germany.

* cited by examiner

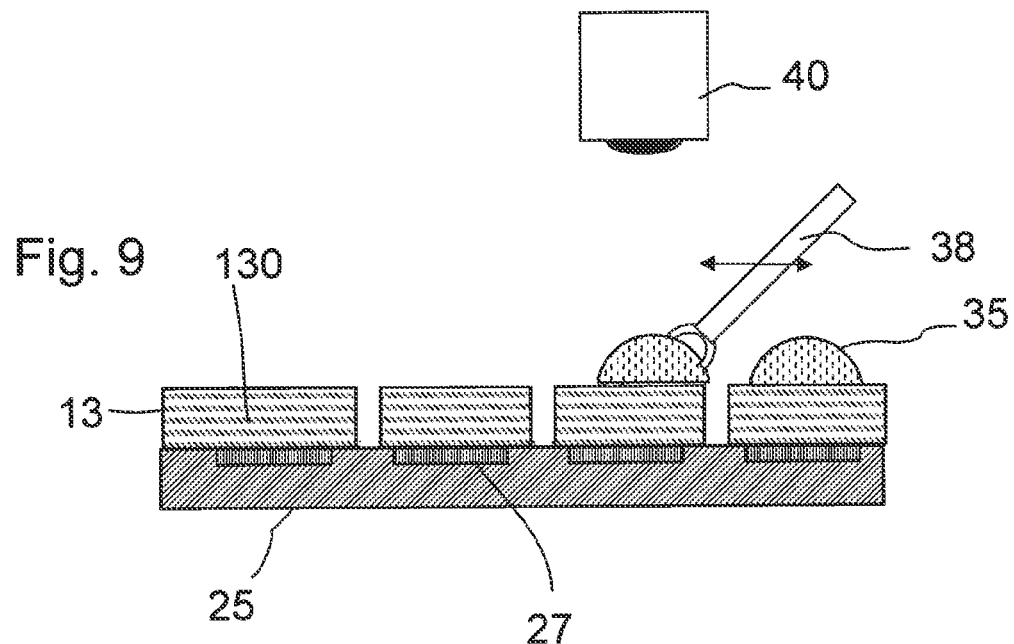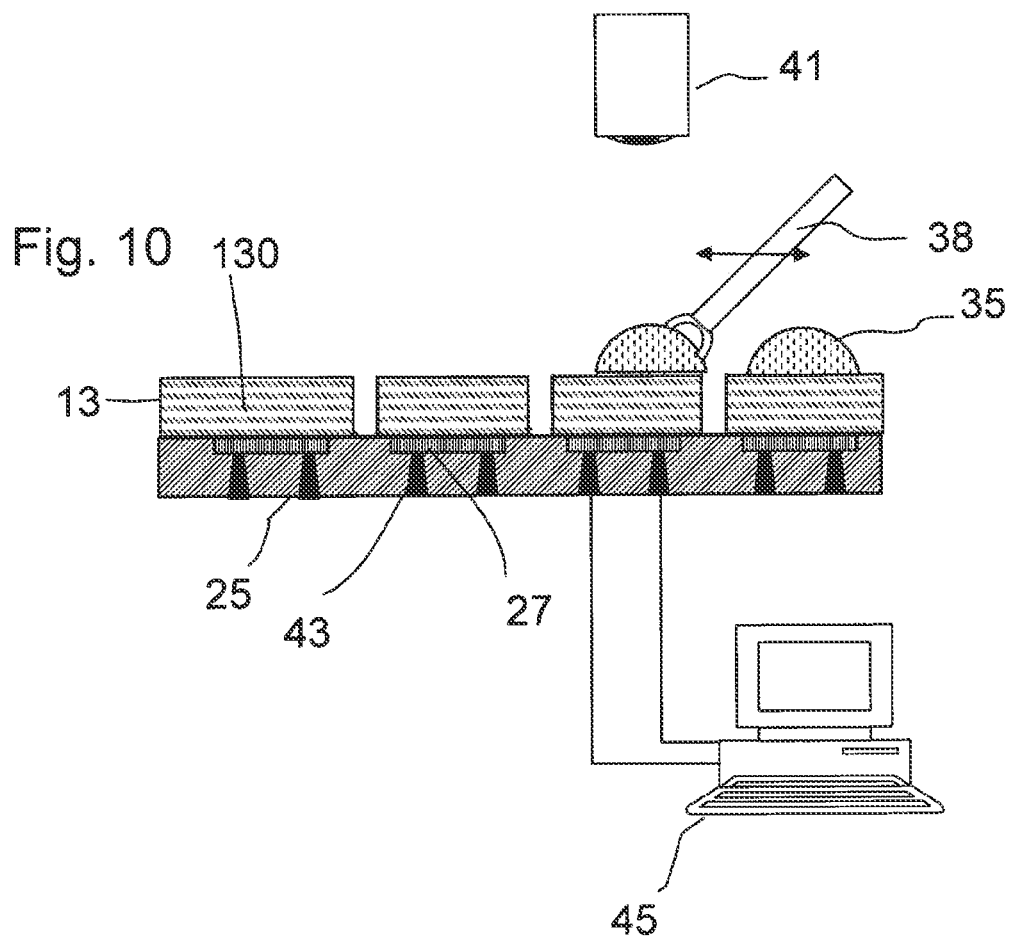

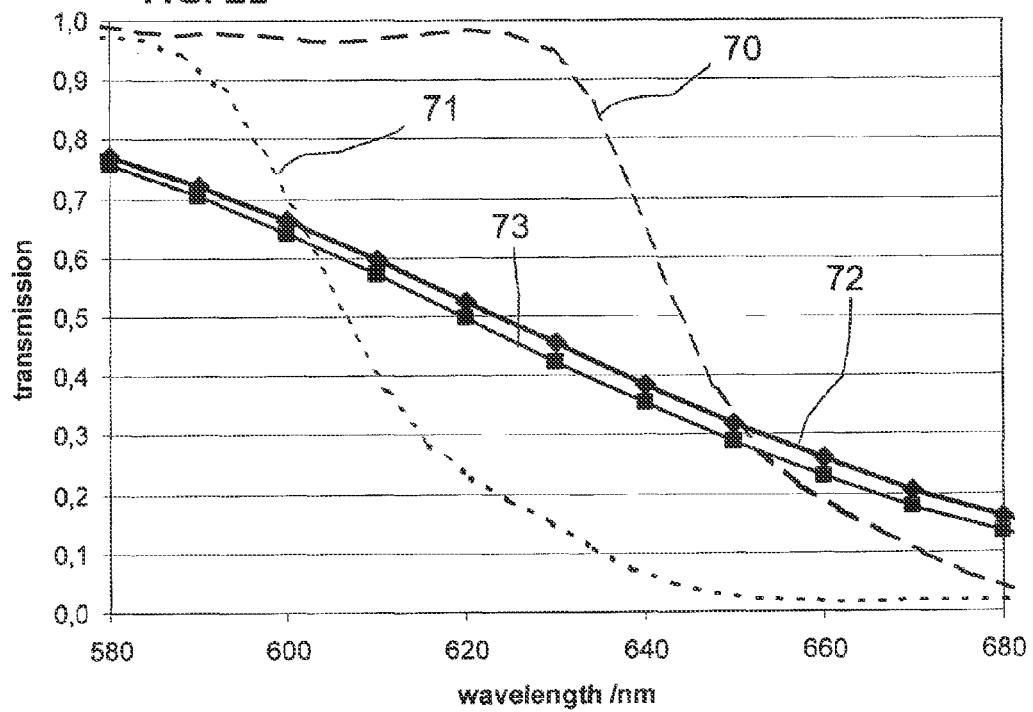
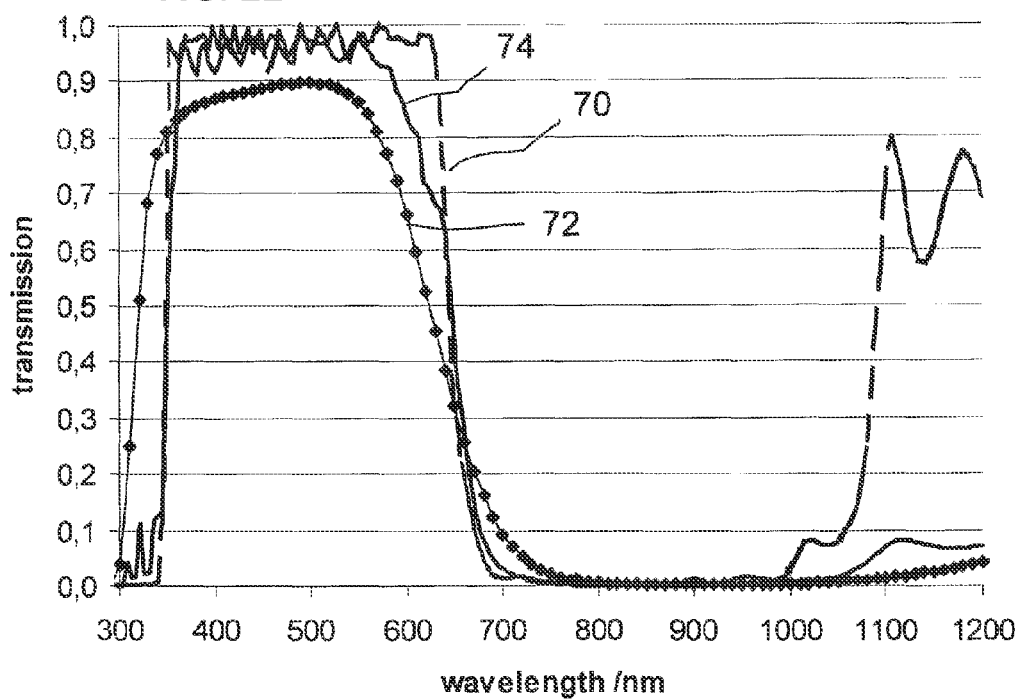

METHOD FOR PRODUCING OPTOELECTRONIC COMPONENTS, AND PRODUCTS PRODUCED THEREBY

The invention relates in general to optoelectronic components and their production. In particular, the invention relates here to the joining of optical components to the optoelectronic functional substrates such as optoelectronic chips or functional wafers having optoelectronic chips.

An increasing miniaturization is to be observed even in the case of optoelectronic components. Thus, ever smaller camera modules are being developed in order to equip cellphones therewith. With increasing miniaturization of the camera chips, the associated optical systems also shrink. Thus, the chips frequently have active sensor surfaces of the order of magnitude of one or a few square millimeters. In order to ensure an adequate light-gathering power of the associated objectives, the distances of the optical elements from the chip surface also drop accordingly. The general problem then exists that the tolerances in alignment of the optical elements relative to the sensor surface must also become ever smaller if the aim is to maintain the recording quality. Thus, in the case of very short focal lengths of miniaturized optical systems or optical elements arranged at a fixed distance from the chip, small deviations in the distance already lead to massive losses in the achievable image sharpness. The same also holds for the lateral positioning of the optical system relative to the sensor surface.

It is therefore the object of the invention to provide qualitatively improved optoelectronic components. In a highly surprisingly simple way, this object is already achieved by means of the subject matter of the independent claims. Advantageous refinements and developments are specified in the dependent claims.

To this end, the invention provides a method for producing optoelectronic components, in particular image signal acquiring or image signal outputting components, in the case of which method optical components are respectively provided, picked up and mounted on a wafer, the optical components preferably respectively being positioned individually or in groups relative to the position of assigned optoelectronic or optical components of the wafer or of a wafer to be connected thereto.

Consequently, the wafer is here a functional wafer on which the optoelectronic circuits of the individual components have been produced. In particular, consideration is given here to silicon wafers on which the optoelectronic circuits are produced.

In accordance with a first development, the optical component is a plane-parallel substrate. The latter serves to cover the sensor regions as an optical window, and can, in particular, also be used with a defined thickness as a precise spacing element for further optical components. The optical components can also have spectrally filtering properties. It is a UV blocking and/or IR blocking action that is thought of here in particular. For example, in this case the previously described plane-parallel substrate can be a filter glass with the aid of which infrared and/or ultraviolet components are filtered out.

In a development of the invention, it is provided, in particular, that the optical components have beam shaping and spectrally filtering action. Particular consideration is given as beam shaping optical elements to refractive, diffractive or refractively/diffractively acting lenses, aspheric lenses or free shapes of the basic body of the optical components. In order to achieve a spectrally filtering action, the optical components can comprise a filter glass, or be appropriately coated. In addition to such a filter coating, for which an interference coating is particularly suitable, it is also possible alternatively or in addition for an antireflection coating and/or a nonscratch coating to be present. Furthermore, an easily cleanable hydrophobic coating can also be applied. By way of example, fluoric layers such as, for example, fluorine alkylsilane containing sol-gel layers can be applied for a hydrophobic action. Not only is a hydrophobic coating that can easily be cleaned advantageous for later use, but rather it is also rendered easier to perform cleaning as early as during production.

In accordance with a further embodiment of the invention, individual chips or groups thereof having optoelectronic circuits are picked up and mounted on a transparent wafer having optical components, for example also integrated optical components, the chips respectively being aligned individually or in groups relative to the position of assigned optical components of the wafer, the alignment being performed with the aid of at least one control parameter measured in the course of the alignment. Control parameters can in this case be register marks, interferometric signals relative to optical axes, camera recording and camera evaluation. In general, it is also possible to apply the alignment techniques used in lithography.

In accordance with another embodiment of the invention, a functional wafer having a multiplicity of optoelectronic circuits with sensor and/or emitter regions is provided, and optical components for the sensor and/or emitter regions of the optoelectronic circuits are fastened on the wafer, at least one optical component respectively being picked up for the optoelectronic circuits, being mounted and being aligned individually with the position of the respective sensor and/or emitter region, the alignment being performed with the aid of at least one control parameter measured in the course of the alignment. This technique is suitable, in particular, also for emitting optoelectronic components such as lasers and laser bars. The optical components can be a single component such as, for example, a single lens, or else an assigned multiplicity of optical components such as, in particular, an optical module having a number of individual components.

In general, the components can be fastened by anodic bonding, adhesive bonding or mechanical fastening. The optical components also need not necessarily be applied directly to the functional wafer. For example, the functional wafer can also already be provided with transparent cover parts on which the optical components are then arranged, aligned and fastened.

It is common to all the embodiments of the invention previously described that, in contrast with previously used so-called pick and place techniques, individual components are not assembled in each case, but that individual components are assembled on a wafer. In this case, the assembling can comprise, on the one hand, an individual alignment and fastening of optical components on a functional wafer or, on the other hand, an individual alignment and fastening of optoelectronic chips on a wafer having optical components.

In a development of the invention, the optical components can, for example, be prepositioned relative to one another in the form of a strand or in the form of a network, preferably with separation points arranged therebetween. Such arrays of optical components can be produced, in particular, by blank pressing from fibers. This method and arrangements, produced thereby, of optical components such as, in particular, lenses are disclosed, for example, in the German patent application with application number 10 2006 001790, whose disclosure with reference to the production of optical components is also fully incorporated in this application. This method for producing optical components comprises the steps of:
- inserting a glass fiber into a press mold having at least two mold halves and a pressing surface area for at least one optical element, and closing the mold,
- heating the mold and the fiber until the cladding area of the fiber and the mold have reached at least the pressing temperature,
- blank pressing the fiber such that a glass part with an optical element is obtained,
- cooling the glass part below the transformation temperature Tg, and
- removing the glass part produced by blank pressing.

The prepositioning is intended to facilitate the groupwise assembly, and can comprise components that are connected to glass strands and rupture points and are produced, in particular by blank pressing. If the press mold in this case has a number of cavities for the optical components that are arranged at a defined distance from one another, the optical components are also arranged on the glass strand at defined distances, and thus prepositioned.

Furthermore, a prepositioning can also be achieved with the aid of spacers obtained by lithographic techniques and that hold the optical components in a prepositioned fashion. A high alignment accuracy can be obtained even in the case of a positioning of a number of optical components in a number of groups, as in accordance with this embodiment of the invention, since difficulties are avoided in aligning all the optical components on an optical wafer relative to all the sensor or emitter regions on a functional wafer with the semiconductor circuits.

Another possibility for prepositioning consists in using preassembled optical modules in positioning carriers, in each case one positioning carrier with a number of optical modules being mounted, and the latter being positioned laterally in common.

In order to achieve an individual alignment of the optical components relative to the sensor and/or emitter regions individually or in groupwise fashion, it is advantageously possible to connect the optoelectronic components and for alignment purposes electric signals of the optoelectronic components to be acquired as control parameters by the connection. One example is that of connecting a camera chip and focusing light onto the sensor via the optical component or module. The alignment can then be performed with the aid of the signal supplied by the sensor. Thus, for example, a point light source or an arrangement of point light sources can be used, and the alignment can be performed by optimizing the size of focus.

In accordance with another development, the alignment is recorded, monitored and controlled by means of an additional optical sensor arrangement, for example an interferometric arrangement provided with a camera. Again, it is possible, for example, to acquire the image of the sensor and/or emitter regions that is focused via the respective optical component or optical module, and to perform the alignment with the aid thereof.

It is particularly expedient in the case of the individual alignment described to use a robot for the mounting and alignment.

A further, alternative or additional possibility for positioning optical systems with high precision on optoelectronic circuits is to fasten a transparent wafer of correspondingly highly accurately defined thickness on a functional wafer with the circuits such that the outside of the transparent wafer is arranged at an accurately defined height above the sensor and/or emitter regions of the circuits. It is then possible to mount optical components such as lenses or optical modules that are then positioned with corresponding accuracy in the direction of the optical axis. Likewise, the optical components can also already be preassembled on the transparent wafer before being connected to the functional wafer. This embodiment of the invention renders it possible, inter alia, for optical systems of short focal length to be accurately positioned over the sensor and/or emitter regions in the direction of the optical axis without a further imperative need of active alignment in this direction.

Consequently, the invention also provides a method for packaging optoelectronic components, in which optoelectronic circuits with sensor and/or emitter regions are packaged in the composite wafer, and in which a transparent wafer, such as, in particular, a glass, glass ceramic and/or optoceramic wafer is produced and mounted and fastened on a functional wafer with the circuits on the functional side of the functional wafer, the transparent wafer being produced with a tolerance of the average thickness of less than ±10 micrometers, preferably less than ±6 micrometers. In a way that is particularly suitable for optical systems of short focal length, the thickness of the wafer is preferably between 50 and 500 micrometers. A thickness in the range of 100 to 400 is particularly preferred, and a thickness of 250 to 350 micrometers is the most preferred.

It is not only the average thickness that is decisive for a highly accurate positioning in the direction of the optical axis, it is also advantageous furthermore, when the thickness fluctuates as little as possible along the wafer such that the distances of the optical components from the functional wafer are respectively fixed in a correspondingly accurate fashion. It is provided to this end in a development of the invention that transparent wafers such as, in particular, a glass, glass ceramic and/or optoceramic wafer are produced whose thickness along the surface of a side fluctuates by at most ±10 micrometers, preferably at most ±6 micrometers.

In order to produce a glass, glass ceramic and/or optoceramic wafer with a tolerance of the average thickness of less than ±10 micrometers, it is proposed to provide a multiplicity of glass, glass ceramic and/or optoceramic wafers from one or more glass, glass ceramic and/or optoceramic plates, to undertake a thickness measurement on the glass, glass ceramic and/or optoceramic wafers, and to carry out a sorting into at least two groups with the aid of the thickness measurement such that wafers of at least one sorted and selected group of wafers have a layer thickness tolerance of less than ±10 micrometers. In the simplest case, wafers of a specific required or desired thickness are selected for further processing, and the remaining wafers are discarded. However, it is also possible to select a number of groups of different thickness or ranges of thickness. It is possible in this case to use corresponding groups of optical elements that are suitable for the respective thickness of the wafers. For example, lenses or lens modules can be provided in groups of different focal lengths and be further processed together with the respectively suitable groups of wafers such that the focal lengths are respectively suitable for the thicknesses of the wafers.

A further, alternative or additional possibility for producing wafers with a tolerance of the average thickness of less than ±10 micrometers consists in polishing the wafers and thereby reducing their thickness, a thickness control being performed during the polishing and/or the pauses between a number of polishing steps.

In accordance with one more alternative or additional development, a thickness measurement is carried out on the glass, glass ceramic and/or optoceramic wafer, and a coating is subsequently deposited whose layer thickness is selected such that the total thickness of the glass, glass ceramic and/or optoceramic wafer with its deposited coating reaches the envisaged thickness with a tolerance in the average thickness of less than ±10 micrometers. For example, a suitable glass layer can be vapor deposited, preferably by electron beam evaporation. In this case, borosilicate glasses have proved to be particularly suitable for vapor deposition. It is, furthermore, advantageous with this embodiment of the invention when the dioptic power of the vapor deposited layer and of the wafer are matched to one another. It is ideal in this case when the wafer material is also used as vapor deposition material.

In order to provide optoelectronic components with optical components that are to be aligned accurately with the sensor and/or emitter regions, it is possible in accordance with one more embodiment of the invention to carry out a method for producing optoelectronic components in which a functional wafer with a multiplicity of optoelectronic circuits is connected to a glass, glass ceramic and/or optoceramic wafer that has a multiplicity of optical components, an optical component being respectively assigned to an optoelectronic circuit, the optical components being produced in the glass, glass ceramic and/or optoceramic wafer by dry etching, in particular reactive ion etching or ion beam etching or ion milling, in a plasma, the structures of the optical components on the wafer being produced by applying a structured intermediate layer and removing both material of the intermediate layer and material of the glass, glass ceramic and/or optoceramic wafer by the reactive ions during the etching process. This method even permits the production of aspheric lenses in an accurately defined lateral position. It is particularly preferred to use photolithographic structuring in order to produce the structured intermediate layer. Since the optoelectronic circuits are also produced by means of photolithographic masks, it is possible to achieve the same positioning accuracy as in the case of the production of the circuits by means of the photolithographic structuring of the intermediate layer. The assembly of the optical components with the optoelectronic circuits can be performed completely in the composite wafer owing to the accurate positioning.

Particularly suitable for removing the wafer material is a fluoric atmosphere, preferably one containing $CF_4$ for producing a plasma for the reactive ion etching in conjunction with a glass, glass ceramic and/or optoceramic wafer with a material that includes at least one component that forms a volatile fluoride with fluorine. The wafer material can include at least one of the components $SiO_2$, $GeO_2$, $B_2O_3$, $P_2O_5$ in particular, for this purpose.

If optical wafers made from glass, glass ceramic or ceramic are bonded on semiconductor functional wafers, the problem arises that different coefficients of thermal expansion of the materials can lead to mechanical stresses that can lead to considerable deformations and to detachment of the optical wafer. If the aim is to circumvent this problem, it is possible, for example, to select a glass that has a coefficient of thermal expansion similar to silicon. In this case, however, there is a severe restriction in selecting the cover glasses that can be used for optoelectronic components, or selection is even fixed. It would therefore be desired already to be able to package optoelectronic components in the composite wafer without the abovenamed restrictions. This problem is solved according to the invention with the aid of a method for producing optoelectronic components in which transparent glass, glass ceramic or optoceramic covers for the optoelectronic circuits are mounted on a functional wafer with a multiplicity of optoelectronic circuits, a glass, glass ceramic and/or optoceramic wafer being connected to a sacrificial substrate, and the glass, glass ceramic and/or optoceramic wafer being divided into individual covers that are interconnected via the sacrificial wafer, and the composite with the sacrificial wafer and the covers being fastened on the functional wafer with the exposed sides of the covers, and the connection between the sacrificial wafer and the covers being undone and the sacrificial wafer being removed such that an intermediate product is obtained with the functional wafer and covers that are fastened on the optoelectronic circuits and are laterally spaced apart from one another.

Since the optical wafer is broken up in this way into individual parts that are connected to the functional wafer in the composite wafer, it is possible for stresses that occur to be reduced so as to prevent intense slagging or detachment of the cover substrate from the optical wafer. Thus, it is then also possible according to the invention to use a functional wafer and a glass, glass ceramic and/or optoceramic wafer whose coefficients of thermal expansion differ at room temperature by at least $3.5*10^{-6} K^{-1}$. This is also possible whenever cover parts are mounted individually or in groupwise fashion on a functional wafer or, conversely, chips are mounted on an optical, transparent wafer such as, in particular, a glass, glass ceramic or optoceramic wafer.

For example, it is possible to use a glass wafer or glass covers with a spectrally filtering glass, in particular an infrared filter glass. An example of such a glass is the Schott glass BG 50. Infrared filter glasses often have coefficients of expansion in the range from 8 to $9*10^{-6} K^{-1}$, whereas, as a semiconductor material for the functional wafer or the chips, silicon has a coefficient of expansion of only approximately $2*10^{-6} K^{-1}$. Further glasses that deviate in part yet more clearly as regards their coefficient of expansion are, for example, optical glasses that are particularly suitable for blank pressing. Even coefficients of expansion of up to approximately $17*10^{-6} K^{-1}$ are known here. Such glasses can also be used in accordance with the invention. Consequently, differences of at least $8*10^{-6} K^{-1}$ or even at least $14*10^{-6} K^{-1}$ can also occur in the linear coefficients of expansion.

A further possibility of obtaining spectrally filtering properties, and one that can also be used in addition to a filter glass, is the use of a glass wafer or of glass covers having a spectrally active coating, in particular an infrared and/or UV filter coating. Specifically, the combination of a filter glass with a filter coating is advantageous in order to obtain a broadband, defined filter action with fixed edges. It is therefore provided in a development of the invention that use is made of a glass wafer or glass covers having spectrally filtering glass, in particular an infrared filter glass and a spectrally active coating, in particular an infrared and/or UV filter coating.

In addition or as an alternative to the possibility described further above of producing optical components by reactive ion etching of a surface provided with a structured intermediate layer, it is also possible to produce integrated optical systems by blank pressing. Provided for this purpose is a method in which use is made of a glass wafer or glass covers, preferably with a low $T_g$ glass having a transformation temperature below 600° C., preferably below 550° C., particularly preferably in the range from 450 to 550° C., and optical components are produced by blank pressing the glass. Silicon press molds are particularly suitable in this case for small optical elements. These silicon press molds can be machined in order to produce the corresponding cavities with the aid of lithographic steps such as are used in semiconductor fabrication. It has surprisingly emerged that it is also possible in addition to use glasses with transformation temperatures above 600° C.—given the use of suitable materials for the press mold, for example silicon, and given a particular control of temperature and mold pressure. A particularly preferred way of controlling temperature and pressure provides for lowering the contact pressure during cooling after pressing in the optical components.

Apart from being suitable for producing refractive lens arrangements on optical wafers, blank pressing is also suitable for producing diffractive elements, such as diffractive lenses, for example.

Alternatively or in addition, it is also possible to produce depressions on an optical wafer or individual transparent covers by blank pressing. After connection to the functional wafer, these then form cavities that hermetically enclose the sensor and/or emitter regions.

Furthermore, there is also the possibility of stacking a number of optical wafers in order to assemble integrated optical systems and optoelectronic circuits on a functional wafer in the composite wafer. Provided to this end for producing optoelectronic components is a method in the case of which is used a stack of at least two glass, glass ceramic and/or optoceramic wafers of which at least one has a multiplicity of optical components that are assigned in their position to optoelectronic components on a functional wafer.

It is preferred, furthermore, for glass, glass ceramic and/or optoceramic wafers with a multiplicity of lenses to be used as optical components. These can generally be produced by blank pressing.

A further, alternative or additional possibility for producing an optical wafer with integrated optical systems is to fasten the optical components, preferably in a prepositioned fashion, on the glass, glass ceramic and/or optoceramic wafer. It is thus possible for multi-element optical systems such as objectives to be preassembled on the transparent wafer and for the latter then to be connected to the functional wafer.

It is a common feature of the embodiments of the invention that an intermediate product is obtained in the case of which the optoelectronic components are assembled together with optical components in the composite wafer. In accordance with one embodiment of the invention, the intermediate product comprises a functional wafer with optoelectronic circuits and covers that are fastened on the optoelectronic circuits and are laterally spaced apart from one another. Such an intermediate product is obtained, for example, when, as described further above, an optical wafer is fastened on a sacrificial substrate, divided and then connected to the functional wafer. In accordance with another embodiment, the intermediate product with a multiplicity of optical or optoelectronic components comprises separated optical or optoelectronic components that are respectively mounted on a wafer, the optical or optoelectronic components respectively being aligned individually with the position of assigned optoelectronic or optical components of the wafer. For example, it is possible in this case for separated chips with optoelectronic circuits to be mounted on a transparent wafer with optical components, preferably integrated optical components, and to be individually aligned in each case with the position of assigned optical components of the wafer. This intermediate product is obtained when, as described further above, separated optoelectronic chips are mounted, aligned and bonded on an optical or transparent wafer, such as a glass, glass ceramic or optoceramic wafer.

If, conversely, optical components are mounted, aligned and bonded on a functional wafer with the optoelectronic circuits, an intermediate product is consequently obtained in the case of which fastened on a functional wafer with a multiplicity of optoelectronic circuits with sensor and/or emitter regions are optical components for the sensor and/or emitter regions of the optoelectronic circuits on the wafer, at least one separated optical component being mounted in each case for the optoelectronic circuits and being aligned individually with the position of the respective sensor and/or emitter region.

It is then possible for optoelectronic chips or components to be produced from the abovementioned intermediate products by separating from the wafer. A preferred field of application in this case is digital image recording devices with such optoelectronic chips. Such image recording devices can be, for example, digital still and video cameras and devices including these, such as: surveillance cameras, imaging devices for applications in automotive engineering, avionics, navigation, robotics, security, and medical engineering, such as in endoscopes, arthroscopes.

As glasses for the cover parts, optical components and optical, transparent glass wafers, consideration is given to filter glasses such as the glasses known under the name of BG 50, borosilicate glasses, such as, for example, borofloat glass, alkali free borosilicate glasses such as, for example, those under the names of AF 37 and AF 45 or D 263. The borosilicate glasses are well suited, inter alia, for connecting to a silicon wafer as functional wafer, since the abovenamed glasses have coefficients of expansion similar to that of silicon.

Figure 2:
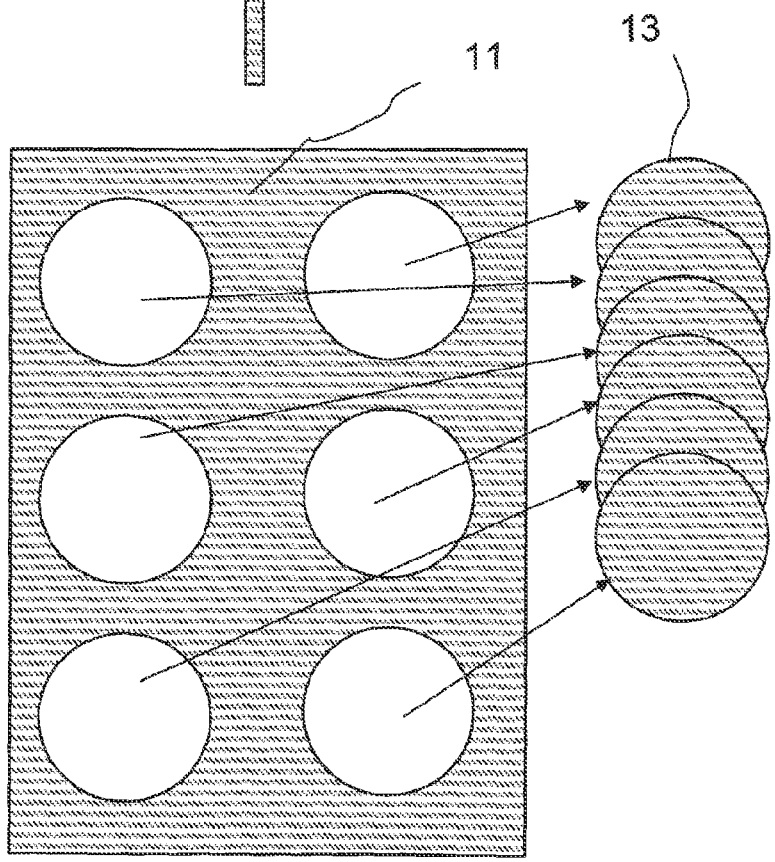
Figure 3:
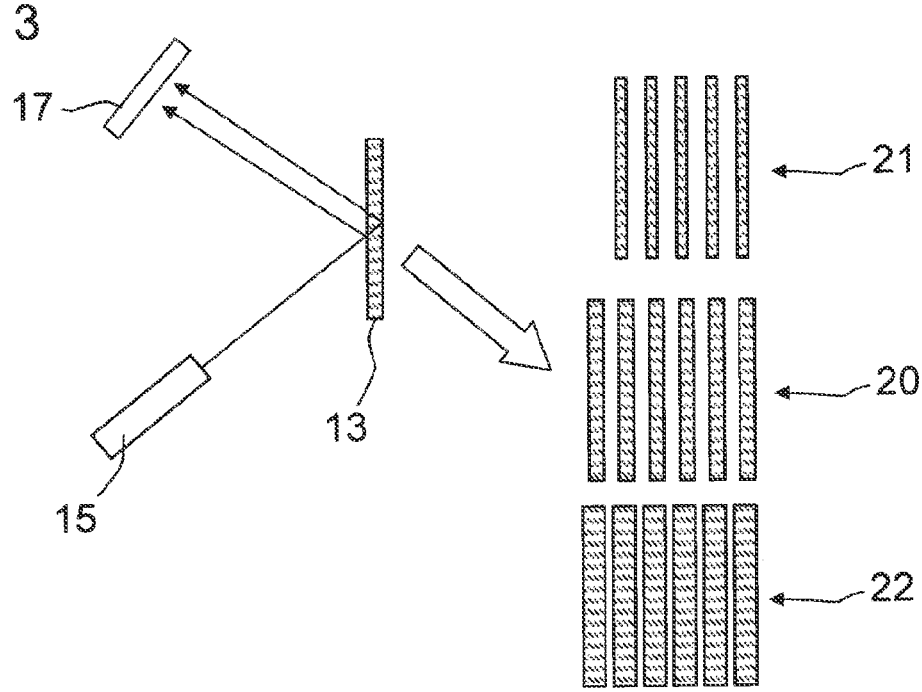
Figure 4:
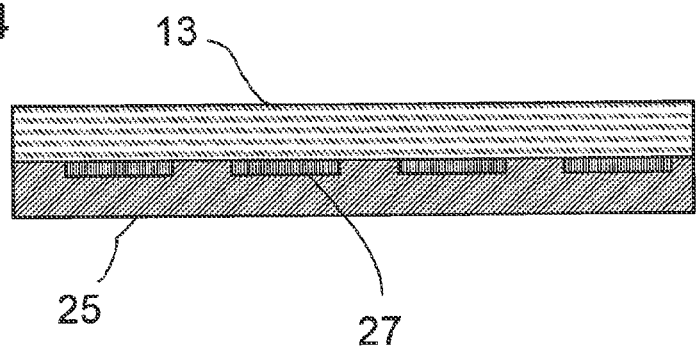
Figure 11:
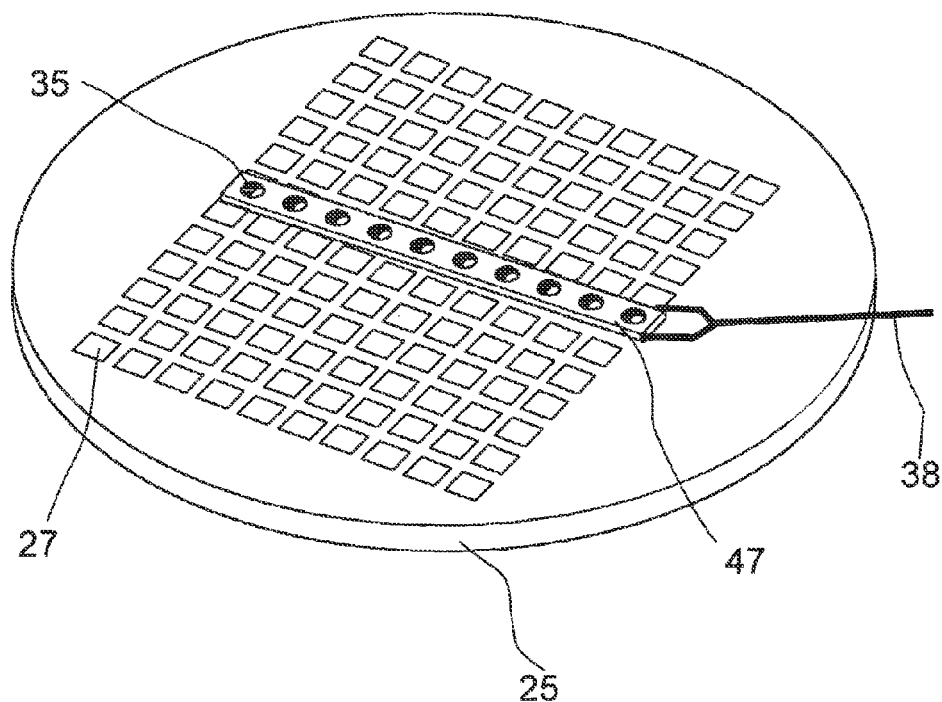
Figure 12:
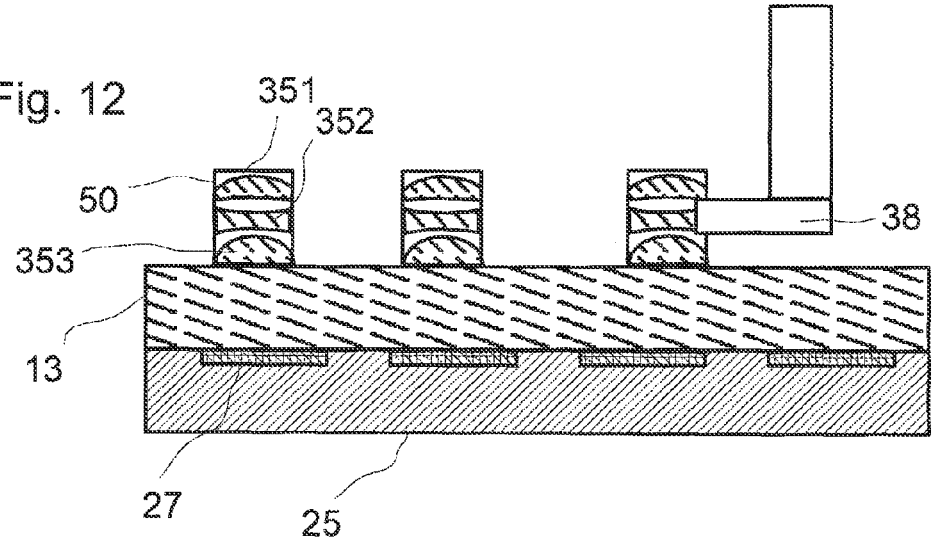
Figure 13:
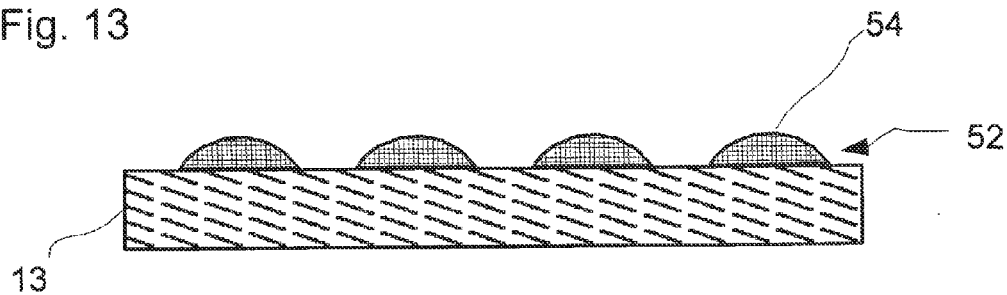
Figure 14:
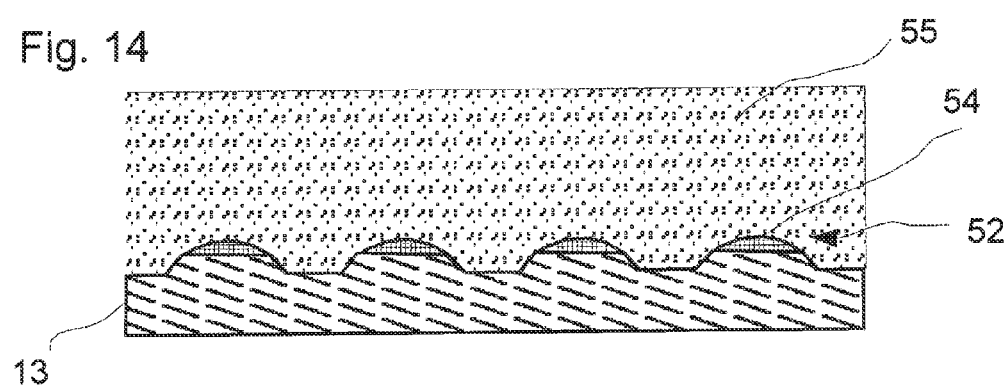
Figure 15:
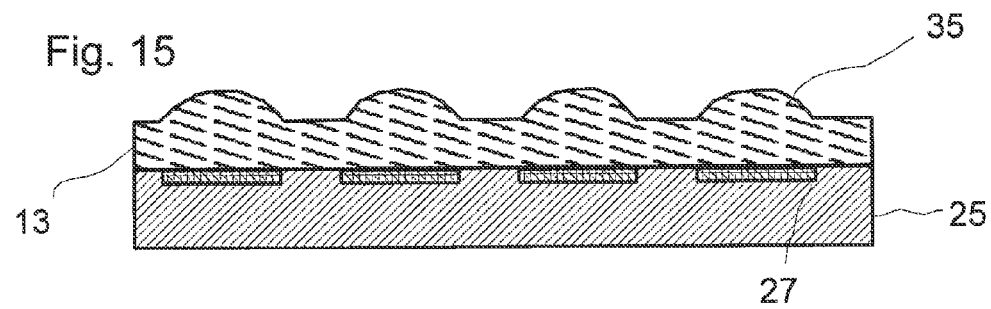
Figure 16:
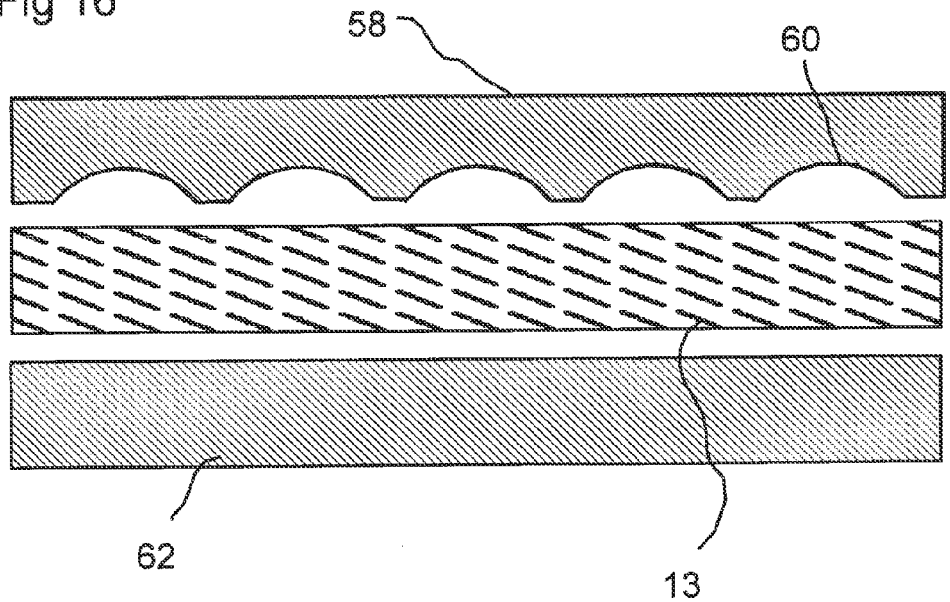
Figure 17:
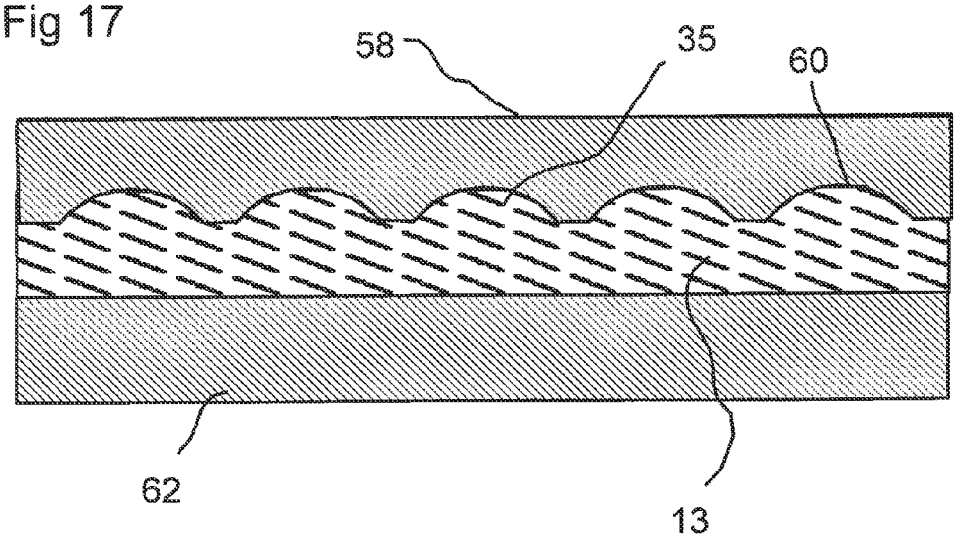
Figure 18:
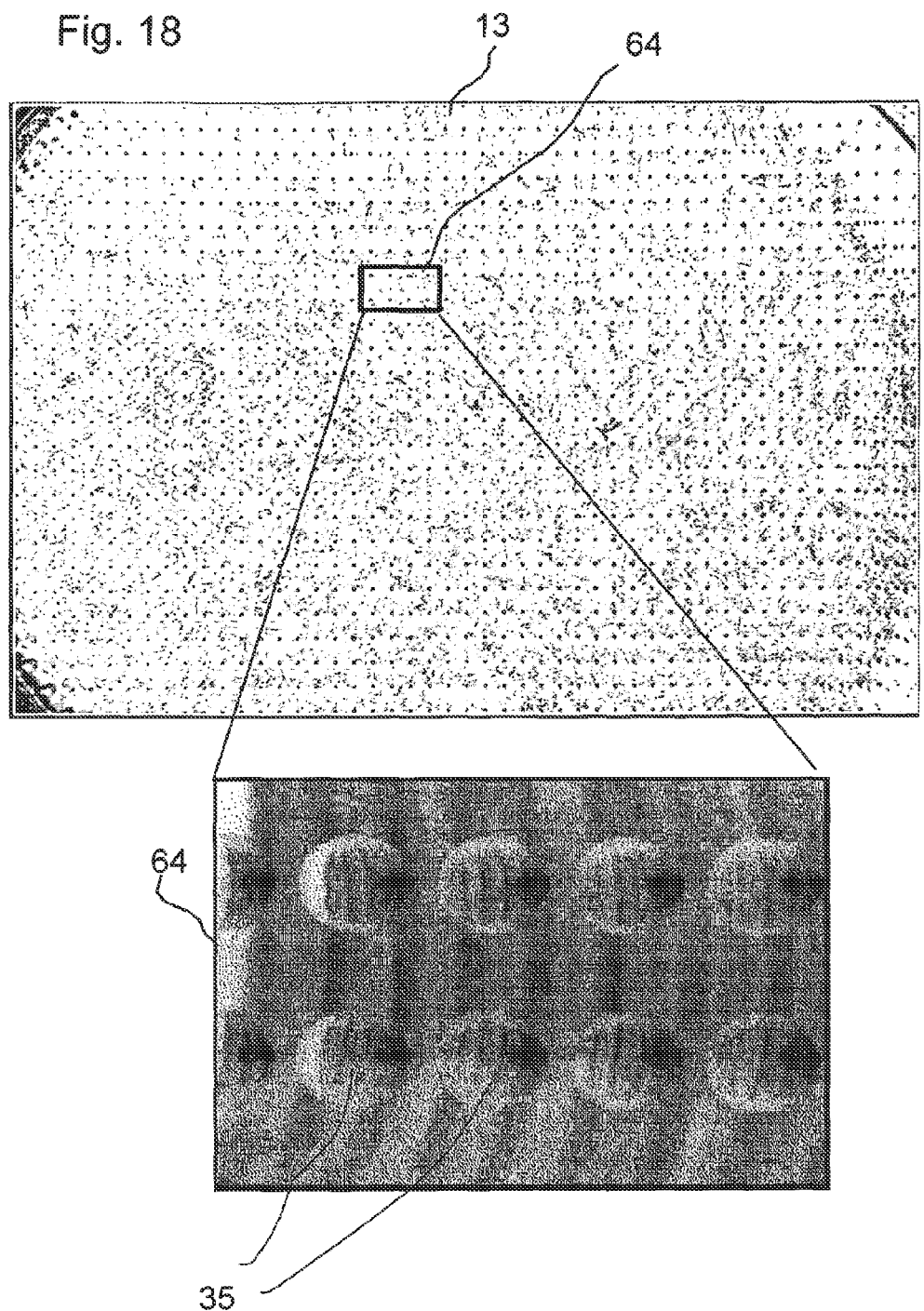
Figure 19:
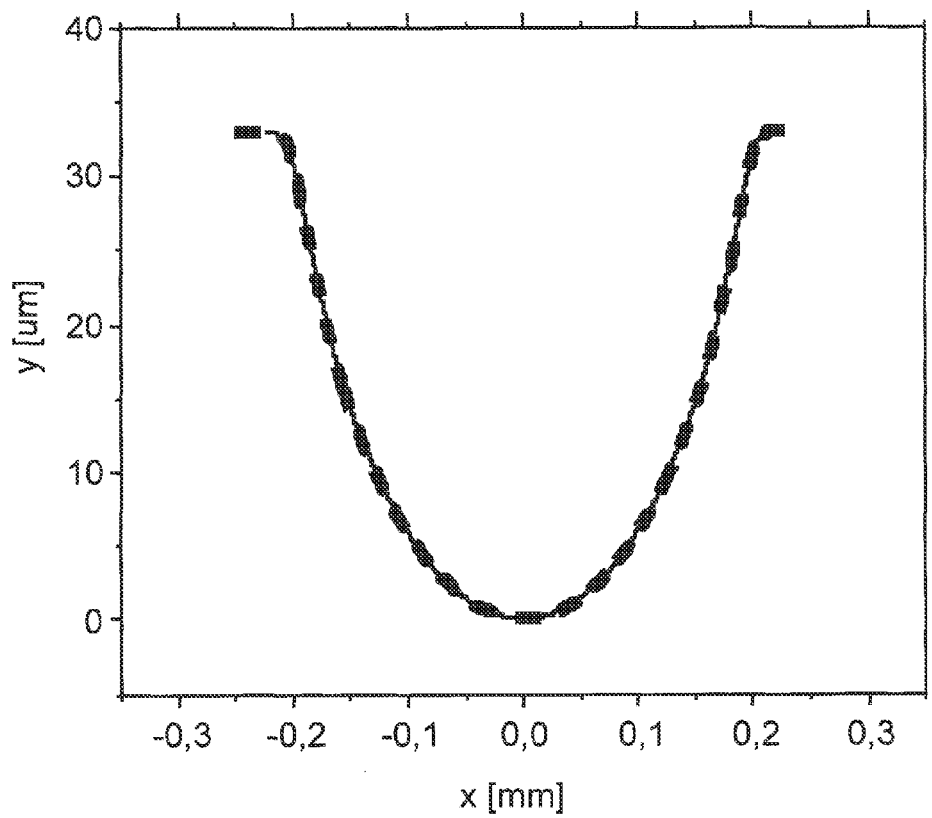
Figure 20:
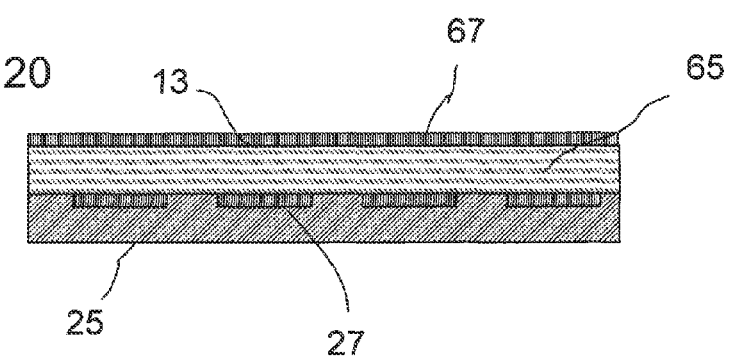

The invention is explained below in more detail with the aid of exemplary embodiments and with reference to the enclosed drawings, in which:

FIG. 1 to FIG. 4 show method steps for producing a composite wafer having a semiconductor functional wafer and a transparent glass cover of low thickness tolerance, FIGS. 5 to 8 show a development of the method steps shown in FIGS. 1 to 4, FIG. 9 shows an arrangement for carrying out method steps for further processing, the functional wafer being provided with lenses, FIG. 10 shows a variant of the arrangement shown in FIG. 9, FIG. 11 shows a variant in the case of which groups of lenses are positioned jointly, FIG. 12 shows a further variant in the case of which optical modules are mounted and aligned, FIGS. 13 to 15 show method steps for producing an intermediate product with a functional wafer and an optical wafer, connected thereto, with integrated optical components, FIGS. 16 and 17 show method steps for producing an optical wafer with a lens arrangement by means of blank pressing, FIG. 18 shows a photograph of a glass wafer, formed by blank pressing, with lenses, FIG. 19 shows profile measurements at a cavity of the press mold, and a lens produced thereby, FIG. 20 shows a variant of the composite wafer illustrated in FIG. 4, and FIGS. 21 and 22 show transmission profiles of a filter coating and an infrared filter glass, as well as their combination.

Method steps for producing a composite wafer with a transparent cover for optoelectronic circuits on a functional wafer are described with the aid of FIGS. 1 to 4. The method is based on packaging the optoelectronic components in the composite wafer by producing a glass wafer and then mounting and fastening it on a functional wafer with the circuits, on the functional side of the functional wafer. In this case, the glass wafer is preferably produced with a thickness between 50 and 500 micrometers and a tolerance of the average thickness of less than ±10 micrometers, preferably less than ±6 micrometers. The thickness of the optical glass wafer also fluctuates in this case by at most ±10 micrometers, preferably at most ±6 micrometers.

To this end, a multiplicity of glass wafers are produced from one or more glass plates, a thickness measurement is performed on the glass, glass ceramic and/or optoceramic wafers, and the thickness measurement is used to carry out a sorting into at least two groups such that the wafers of at least one sorted group of wafers have a layer thickness tolerance of less than ±10 micrometers.

FIG. 1 shows for this purpose the production of the glass plates by means of a down-draw apparatus 1. The apparatus 1 comprises a pot 3 that is filled with glass melt 5. The glass melt 5 runs out of a slotted nozzle 4 as a strand 7 and cools down to form a solid glass strand. The latter is dissected by means of a separation apparatus into individual glass plates 11.

As shown schematically in FIG. 2 in a plan view of a glass plate, glass wafers 13, with a diameter of 8 inches, for example, are then cut out of the glass plates 11.

As illustrated in FIG. 3, this is followed by a thickness measurement and sorting into groups 20, 21, 22 of varying thickness. The thickness measurement is performed in the example shown by means of a triangulation measuring apparatus. In this case, a laser beam of a laser 15 is directed obliquely onto a wafer 13. The laser light is reflected in this case at the surfaces of the two sides so as to produce two parallel beams that are detected by a sensor 17. The thicker the wafer, the larger the parallel spacing between the light beams. The classification into the various groups 20, 21 and 22 is performed inside a group such that the average thickness of the wafers 13 differs by at most ±10 micrometers, preferably less than ±6 micrometers.

As shown in FIG. 4, the glass wafers 13 are then bonded onto a functional wafer 10 in the form of a semiconductor wafer 25 with a multiplicity of optoelectronic circuits, for example camera sensors. The bonding can be performed, for example, by means of a bonded connection, an anodic bonding, low-temperature bonding with the formation of an inorganic network between the wafers 13 and 25, or else by means of rapid local melting of a metal coating, for example by means of a laser.

The optoelectronic circuits 27 are now packaged hermetically by means of the optical wafer 13. Moreover, on the basis of the thickness selection the outside of the optical wafer 13 is at an accurately defined distance from the encapsulated surface of the semiconductor wafer 25 with the optoelectronic circuits 27. This now permits optical components such as, in particular, lenses or lens modules, to be mounted directly on the glass wafer 13. An adjustment of the distance may accordingly be dispensed with.

A development of the abovedescribed exemplary embodiment is explained with the aid of FIGS. 5 to 8. This development is based on the fact that the functional wafer 25 is provided with a multiplicity of optoelectronic circuits 27 with individual glass covers for the optoelectronic circuits, a glass wafer being connected to a sacrificial substrate, and the glass wafer being divided into individual covers that are interconnected via the sacrificial wafer, and the composite with the sacrificial wafer and the covers is fastened on the functional wafer with the exposed sides of the covers, and the connection between the sacrificial wafer and the covers is undone and the sacrificial wafer is removed such that an intermediate product is obtained with the functional wafer and covers that are fastened on the optoelectronic circuits and are laterally spaced apart from one another.

Figure 5:
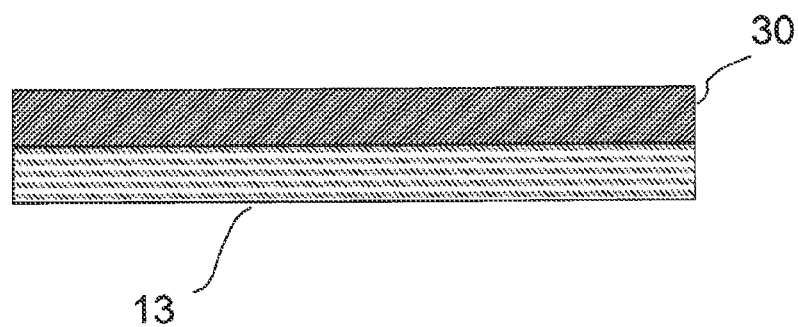
Figure 6:
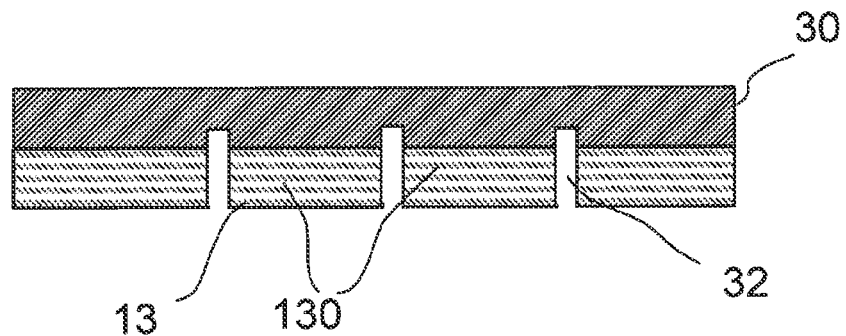
Figure 7:
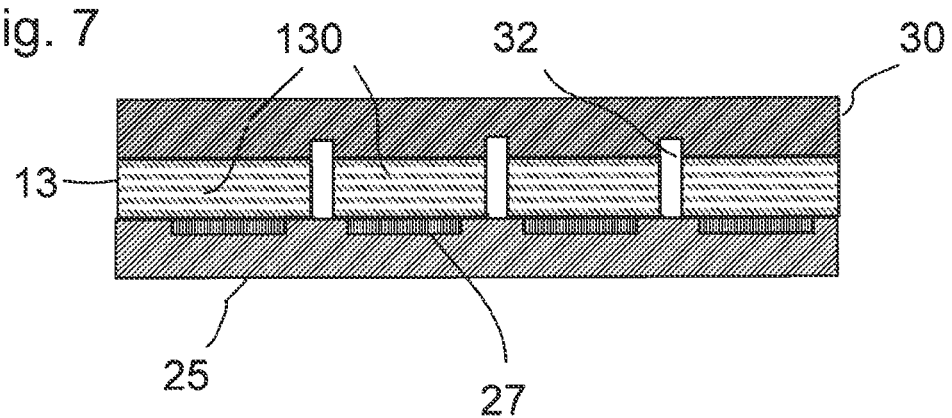

In a way as obtained, for example, in accordance with the method explained with the aid of FIGS. 1 to 3, a wafer 13 is firstly, as shown in FIG. 5, fastened on a sacrificial wafer 30. A bonded connection that can be undone, in particular, can be used for fastening. For example, a thermally removable adhesive is conceivable when the sacrificial wafer is transparent to UV light, a UV removable adhesive. Introduced subsequently into the glass wafer 13 are cuts 32 that sever the glass wafer 13. As shown in FIG. 6, the cuts can also in this case reach into the sacrificial wafer 30 without severing the latter. The inserted cuts provide mutually separated cover parts 130 that are, however, interconnected via the sacrificial wafer 30.

This composite is then bonded to the cover parts on the semiconductor wafer 25, and the sacrificial wafer 30 is removed such that in each case an optoelectronic circuit 27 is covered and encapsulated by a cover part 130.

This has the advantage, inter alia, that it is also possible to use glasses whose coefficient of expansion differs clearly from that of the functional wafer 25. Thus, for example, it is possible to use glasses whose coefficient of thermal expansion at room temperature differs by $3.5*10^{-6}$ K$^{-1}$ or more from the coefficient of expansion of the functional wafer. If a silicon wafer is used as functional wafer, the linear coefficient of thermal expansion can consequently deviate by $\alpha=3.5*10^{-6}$ K$^{-1}$ or more from the value of $\alpha=2.0*10^{-6}$ K$^{-1}$ for silicon. It is then also possible, for example, to use special filter glasses that have strongly deviating linear expansion coefficients.

Figure 8:
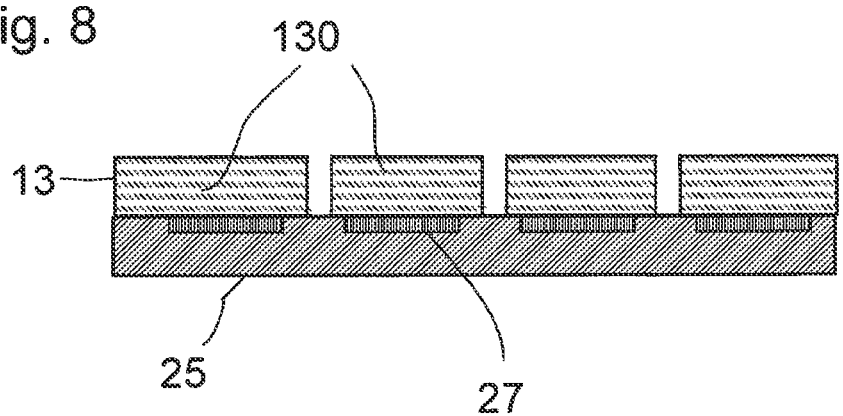

Starting from the intermediate product shown in FIG. 8, FIG. 9 shows method steps for further processing the functional wafer 25 provided with the glass cover parts 130. The method can likewise be carried out with the aid of the intermediate product shown in FIG. 4. Specifically, lenses 35 are now mounted on the wafer 25. The method is now based on the fact that the functional wafer 25 is provided with a multiplicity of optoelectronic circuits 27 with sensor and/or emitter regions, and that optical components in the form of lenses 35 for the sensor and/or emitter regions of the optoelectronic circuits are fastened on the wafer 25, at least one lens 35 respectively being picked up for the optoelectronic circuits, mounted and individually aligned with the position of the respective sensor and/or emitter regions, the alignment being performed with the aid of at least one control parameter measured in the course of the alignment.

A robot arm 38 is used for picking up, mounting and aligning. The robot arm 38 can be equipped here with a sucker for holding a lens 35. Since the spacing of the lenses 35 is already optimized by the accurately defined thickness of the cover parts 130 or of the optical wafer 13, a further lateral alignment is performed in this example.

The alignment of the lens relative to the assigned optoelectronic circuit, lying therebelow, or to the sensor and/or emitter regions is detected by means of an additional sensor arrangement, the accurate alignment being performed with the aid of the data of this sensor arrangement. Specifically, a camera 40 is provided here that records the positioning of the lens. The robot is monitored and controlled with the aid of the images. If the lateral position of the lens 35 is optimized, this is fixed. For example, a UV-curing adhesive can be used. The adhesive between the lens 35 and cover part 130 is firstly liquid, or at least viscous, such that the lens can be laterally displaced. Once the correct position has been found, the adhesive can be quickly cured by UV irradiation, and the lens can thereby be permanently fastened.

FIG. 10 shows a variant of the arrangement shown in FIG. 9. In this variant, the optoelectronic components, or the optoelectronic circuits are interconnected, and for the purpose of alignment electric signals of the optoelectronic components are detected by the interconnection as control parameters. In the case of the example shown in FIG. 10, the optoelectronic circuits make contact with the rear side of the wafer via conducting channels. The respective circuit 27 is now interconnected via these channels and connected to a control device 45. The image of a light source 41 is evaluated by the control device 45, and the robot arm 38 is controlled with the aid of this evaluation. For example, the lens can be moved laterally until there is an optimal focusing onto the sensor region of the optoelectronic circuit 27. Subsequently, the lens 35 is finally fixed, as already described with the aid of FIG. 9.

FIG. 11 shows a schematic view of a further variant. In this variant, a glass strand 47 is respectively fastened on the functional wafer 25 with the aid of a number of lenses 35. The lenses 35 are arranged on the glass strand 47 in a defined spacing that corresponds to the spacing of the optoelectronic circuits 27 on the functional wafer. The lenses 35 are therefore already prepositioned in one direction. The robot arm 38 now positions the strand 47 such that the lenses 35 are optimally aligned with the optoelectronic circuits 27. Here, the positioning can be carried out as described with the aid of FIG. 9 or FIG. 10. It is advantageous here when alignment is undertaken for at least two of the lenses or of the assigned optoelectronic circuits 27. For example, two optoelectronic circuits can be interconnected to this end, and their signals can be used to control the alignment.

FIG. 12 shows a further variant in the case of which optical modules are mounted and aligned. In a departure from the two exemplary embodiments of FIGS. 10 and 11, use is made here of an intermediate product such as illustrated in FIG. 4. As in the case of the examples shown in FIGS. 9 and 10, optical components are mounted on the functional wafer 25 by means of a controlled robot arm 38, and aligned individually with the respective optoelectronic circuits 27 and fixed. In a departure from the examples explained above, however, prefabricated optical modules 50 having a number of lenses 351, 352, 353 are mounted and positioned.

In accordance with one variant of the method shown in FIG. 12, the optical modules 50 are mounted on the optical wafer 13 and fixed before the wafer 13 is bonded to the functional wafer 25. In this case, as well, it is possible to align individually with the position of the respective sensor and/or emitter region, for example by performing the alignment with the aid of aligning marks, for example, of a suitable mask.

In this variant, wherein an optical wafer with a preassembled optical system is provided, optical components are consequently respectively provided in the form of optical modules, picked up and mounted on a wafer, the optical components respectively being positioned individually or in groups relative to the position of assigned optoelectronic components of a functional wafer that is to be connected thereto later.

FIGS. 13 to 15 show method steps for producing an intermediate product having a functional wafer and an optical wafer that is connected thereto and has integrated optical components. In this example, before the assembly an optical wafer is provided with optical components, specifically with lenses here. The method is based on the fact that a functional wafer with a multiplicity of optoelectronic circuits is connected to a glass, glass ceramic and/or optoceramic wafer that has a multiplicity of optical components, an optical component respectively being assigned to an optoelectronic circuit, the optical components being produced in the glass, glass ceramic and/or optoceramic wafer by dry etching, in particular reactive ion etching, ion beam etching, ion milling, in a plasma, the structures of the optical components on the wafer being produced by applying a structured intermediate layer and removing both material of the intermediate layer and material of the glass, glass ceramic and/or optoceramic wafer by the reactive ions during the etching process.

To this end, as illustrated in FIG. 13 the first step is to apply a structured intermediate layer 52 having lens-shaped structures 52 to a glass wafer 13. The distribution of the lens-shaped structures corresponds in this case to the distribution and arrangement of optoelectronic circuits on a functional wafer. The intermediate layer can be produced photolithographically, for example. Gray tone lithography, for example, can be used in order to obtain structures curved in the shape of a lens from the photolithographically produced structures of the intermediate layer. A further possibility is to fuse the intermediate layer after the structuring such that the surface tension of the fused material converts the structures into the shape of a drop.

As shown in FIG. 14, the side of the wafer 13 with the lens-shaped structures 54 is subsequently treated by reactive ion etching in a plasma 55. To this end, a fluoric atmosphere, preferably one containing $CF_4$, is used for producing a plasma for the reactive ion etching. In this case, the wafer 13 includes a material that includes at least one component that forms a volatile fluoride with fluorine. It is preferred to use a glass having at least one of the components $SiO_2$, $GeO_2$, $B_2O_3$, $P_2O_5$. The exposed regions of the wafer that are not covered by the structures 54 are removed in this case with the formation of volatile fluorides. At the same time, the structures 54 are also removed such that in the course of the etching operation at their edge further regions of the wafer surface are exposed and etched. The lens-shaped structures are then also formed in the glass on the basis of this etching operation. As illustrated in FIG. 15, a wafer produced in such a way and having lens 35 can then be bonded onto a functional wafer 25.

FIGS. 16 and 17 show a further possibility for producing optical wafers 13 with lens arrangements. The method is based on producing optical components on a glass wafer by blank pressing of the glass. Use is made to this end of a press mold with press mold halves 58, 62. The press mold half 58 has a multiplicity of cavities 60. The cavities are constructed as negative shapes of the lenses to be produced. In particular, these cavities can also be aspheric, in order to produce corresponding aspheric lenses. It is preferred to use a glass wafer 13 made from a low $T_g$ glass, that is to say a glass with a transformation temperature below 600° C. As shown in FIG. 16, the glass wafer 13 is laid between the preheated press mold halves 58, 62, and the press mold halves are pressed together. The hot glass of the glass wafer then begins to flow and fills up the cavities 60 such that lenses 35 are constructed, as shown in FIG. 17.

Silicon is used as material for the press mold half 58. The cavities can be produced in this way by means of lithography steps such as are used in semiconductor fabrication.

FIG. 18 shows a photographic picture of such a glass wafer 13. The edge of the wafer 13 is visible at the corners of the image. A section 64 is illustrated in an enlarged fashion below the photographic picture. It is to be seen that the lateral position of the lenses on the wafer 13 can be produced with a tolerance of less than 20 micrometers distance of the center of the lens from the desired position by blank pressing.

The lateral positions of the lenses 35 are therefore so accurately defined that even given small sensor surfaces in the region of one or a few square millimeters it is possible to carry out an accurate alignment of the lenses relative to the optoelectronic circuits by aligning and bonding the optical wafers on a functional wafer with optoelectronic circuits in accordance with the example shown in FIG. 15.

FIG. 19 shows measurements of the profile of a cavity 60 (thick dashed line) and of a lens 35 produced therewith (continuous line). As is made plain with the aid of this measurement, the two profiles lie one upon another in practice with no detectable deviation. The lens shape of the cavity is therefore imaged very well onto the lenses produced. In particular, it is also possible to limit the deviation in shape from the desired shape to much below 1 micrometer.

FIG. 20 shows a variant of the composite wafer illustrated in FIG. 4. The optical wafer 13 of this exemplary embodiment comprises a colored glass 65, for example a glass marketed by the applicant under the name of BG 50, and an infrared filter coating 67. The infrared filter coating is a single-layer or preferably multilayer interference coating. In the case of the example shown, the infrared filter coating 67 is applied to the side of the optical wafer 13 averted from the functional wafer 25. The infrared filter coating 67 can, however, also be applied to the opposite side, facing the functional wafer 25, or to both sides.

On a first look, no advantages seem to result from a combination of an infrared filter glass and an additional filter coating on the basis of the similar action. However, it emerges that combining the two measures results in very advantageous properties that renders them particularly suitable for infrared filtering of camera sensors.

FIGS. 21 and 22 show to this end transmission profiles of a filter coating and of an infrared filter glass, as well as their combination. The spectral transition region between visible and infrared light is illustrated in FIG. 21. The curve 70 is the transmission of an infrared filter coating 67 in the case of vertical light incidence. The curve 71 shows the transmission of this infrared filter coating 67 in the case when light is incident at an angle of 35° measured relative to the surface normal.

The curves 72 and 73 further show the transmission of a BG5 filter glass given vertical incidence (curve 72) and oblique incidence, likewise at 35° to the normal. As is to be seen from the curves 72 and 73, the filter glass exhibits only a negligible dependence of the transmission on the angle of incidence. By contrast, in the case of the infrared filter coating 67 when light is incident obliquely the cut off edge is significantly displaced into the visible region. On the other hand, the falling edge in the transmission of the infrared filter coating 67 is significantly sharper, particularly when light is incident vertically.

Because of the slight angular dependence of the transmission profile, the filter glass 65 is well suited to wide angle optical systems. In addition, the infrared filter coating 67 can be used to attain a sharp edge in the transmission during transition into the infrared region, and so short wave infrared components are cut off.

The combination of an infrared filter glass with an interference coating is also advantageous for a further reason. FIG. 22 shows the transmission profiles over a relatively large wavelength region. The transmission profiles for oblique incidence of light are not illustrated here, for reasons of clarity. The curve 74 is the transmission for an infrared filter coating in combination with the BG50 filter glass, that is to say for an optical cover wafer 13 such as is shown in FIG. 20.

The transmission profile 70 of the infrared filter coating 67 again exhibits an increase in transmission in the region above 1 micrometer wavelength. However, silicon camera sensors are still sensitive in this wavelength region, and so undesired exposure effects can occur. The filter glass blocks these components very effectively, however, and so there is only a very slight transmission in this wavelength region in the transmission profile 74 of the infrared filter coating 67 combined with a filter glass. In addition, the drop in the transmission upon transition into the infrared region is also significantly steeper than in the case of a filter glass without infrared filter coating 67.

It is evident to the person skilled in the art, that the invention is not limited to the abovedescribed exemplary embodiments. Rather, the individual features of the exemplary embodiments can also be combined with one another in multifarious ways.

What is claimed is:

1. A method for producing optoelectronic components, the method comprising:
providing optical components;
picking up, by means of a robot arm, the optical components provided;
subsequent to picking up the optical components, mounting the optical components directly on a first wafer by means of the robot arm;
wherein the first wafer has optoelectronic components attached, and the optical components being positioned individually or in groups relative to the position of the optoelectronic components of the first wafer using the robot arm; and
utilizing, as the first wafer, a glass wafer having i) spectrally filtering glass being an infrared filter glass and ii) an infrared filter coating, the glass wafer having a thickness in the range of 50 to 500 micrometers.

2. The method as claimed in claim 1, in which the first wafer is transparent and individual chips or groups thereof having optoelectronic circuits are picked up and mounted on the first wafer having optical components, the chips respectively being aligned individually or in groups relative to the position of assigned optical components of the first wafer, the alignment being performed with the aid of at least one control parameter measured in the course of the alignment.

3. The method as claimed in claim 1, in which a functional wafer having a multiplicity of optoelectronic circuits with sensor and/or emitter regions is provided, and optical components for the sensor and/or emitter regions of the optoelectronic circuits are fastened on the wafer, at least one optical component respectively being picked up for the optoelectronic circuits, being mounted and being aligned individually with the position of the respective sensor and/or emitter region, the alignment being performed with the aid of at least one control parameter measured in the course of the alignment.

4. The method as claimed in claim 1, wherein the optoelectronic components are interconnected, and for alignment purposes electric signals of the optoelectronic components are detected as control parameters by the interconnection.

5. The method as claimed in claim 1, wherein the glass wafer or glass covers that are utilized comprise glass having a transformation temperature below 600° C., and wherein optical components and/or cavities are produced by blank pressing the glass.

6. The method as claimed in claim 2, wherein the step of utilizing the glass wafer comprises producing depressions on the glass wafer by blank pressing, and
connecting the glass wafer to the first wafer, wherein the first wafer is a functional wafer having sensor and/or emitter regions, so as to form cavities that hermetically enclose the sensor and/or emitter regions of the functional wafer.

7. The method as claimed in claim 2, wherein depressions are produced on individual transparent covers by blank pressing, and the individual transparent covers are connected to the first wafer, the first wafer being a functional wafer having sensor and/or emitter regions, so as to form cavities that hermetically enclose the sensor and/or emitter regions of the functional wafer.

8. A method for producing optoelectronic components, the method comprising:
providing optical components;
picking up, by means of a robot arm, the optical components provided;
subsequently to picking up the optical components, mounting the optical components directly on a first wafer by means of the robot arm;
wherein the optical components are positioned individually or in groups relative to a position of the optoelectronic components of a further wafer to be connected thereto using the robot arm; and
utilizing, as the further wafer, a glass wafer having i) spectrally filtering glass being an infrared filter glass and ii) an infrared filter coating, the glass wafer having a thickness in the range of 50 to 500 micrometers.

* * * * *